(12) United States Patent
Baker et al.

(10) Patent No.: US 10,288,693 B2
(45) Date of Patent: May 14, 2019

(54) STATE OF CHARGE ESTIMATOR AND METHODS OF MAKING AND USING THE SAME

(71) Applicant: GM Global Technology Operations LLC, Detroit, MI (US)

(72) Inventors: Daniel R. Baker, Romeo, MI (US); Mark W. Verbrugge, Troy, MI (US); Patrick Frost, Novi, MI (US); Brian J. Koch, Berkley, MI (US); Charles W. Wampler, II, Birmingham, MI (US); Patricia M. Laskowsky, Ann Arbor, MI (US)

(73) Assignee: GM Global Technology Operations LLC, Detroit, MI (US)

(*) Notice: Subject to any disclaimer, the term of this patent is extended or adjusted under 35 U.S.C. 154(b) by 745 days.

(21) Appl. No.: 14/257,572

(22) Filed: Apr. 21, 2014

(65) Prior Publication Data

US 2015/0301116 A1    Oct. 22, 2015

(51) Int. Cl.
*G01R 31/36* (2006.01)

(52) U.S. Cl.
CPC ..... *G01R 31/3662* (2013.01); *G01R 31/3651* (2013.01); *G01R 31/362* (2013.01)

(58) Field of Classification Search
None
See application file for complete search history.

(56) References Cited

U.S. PATENT DOCUMENTS

| | | | | |
|---|---|---|---|---|
| 6,160,382 A | * | 12/2000 | Yoon | G01R 31/3651 320/134 |
| 7,212,934 B1 | * | 5/2007 | Hall | G01R 31/3658 702/65 |

(Continued)

FOREIGN PATENT DOCUMENTS

| | | |
|---|---|---|
| CN | 102062841 A | 5/2011 |
| CN | 102540084 A | 7/2012 |

(Continued)

OTHER PUBLICATIONS

G.L.. Plett; Journal of Power Sources; Extended Kalman filtering for battery management systems of LiPB-based HEV battery packs Part 3. State and parameter estimation. 134(2004) 277-292.

(Continued)

*Primary Examiner* — Alexander Satanovsky
*Assistant Examiner* — Brent A. Fairbanks
(74) *Attorney, Agent, or Firm* — BrooksGroup

(57) ABSTRACT

A number of variations include a method, which may include using at least a segment of voltage-based Battery State Estimation data, and using real-time linear regression, which may be a method of estimating future behavior of a system based on current and previous data points, to provide a robust and fast-adapting impedance response approximator. Linear regression may be performed by forming an RC circuit which is "equivalent" to electrochemical impedance spectroscopy data and processing the runtime values of that RC circuit using any number of known real-time linear (Continued)

regression algorithms including, but not limited, to a weighted recursive least squares (WRLS), Kalman filter or other means.

14 Claims, 6 Drawing Sheets

(56) References Cited

U.S. PATENT DOCUMENTS

| | | | | |
|---|---|---|---|---|
| 8,918,300 B2* | 12/2014 | Baba | ................. | G01R 31/3624 702/63 |
| 9,417,290 B1* | 8/2016 | Wang | ..................... | G06F 15/00 |
| 2006/0170397 A1* | 8/2006 | Srinivasan | ......... | G01R 31/3624 320/132 |
| 2008/0054848 A1* | 3/2008 | Yun | .................... | G01R 31/3651 320/134 |
| 2013/0030596 A1* | 1/2013 | Okada | ................ | G01R 31/3651 700/297 |
| 2014/0049226 A1* | 2/2014 | Mao | ................... | G01R 31/3651 320/162 |
| 2014/0244225 A1* | 8/2014 | Balasingam | ........ | G06F 17/5036 703/2 |

FOREIGN PATENT DOCUMENTS

| | | |
|---|---|---|
| CN | 102901930 A | 1/2013 |
| CN | 103592604 A | 2/2014 |
| WO | 2013051241 A1 | 4/2013 |

OTHER PUBLICATIONS

G.L.Plett; Journal of Power Sources, Extended Kalman filtering for battery management systems of LiPB-based HEV batter packs Part 2. Modeling and identifications ; 134(2004) 262-276.

G.L. Plett ; Journal of Power Sources; Extended Kalman filtering for battery management systems of LiPB-based HEV battery packs Part 1. Background; 134(2004) 252-261.

M. Verbrugge, "Adaptive Characterization and Modeling of Electrochemical Energy Storage Devices for Hybrid Electric Vehicle Applications," M. Schlesinger(editor), chapter 8, Modern Aspects of Electrochemistry, No. 43 : Modeling and Numerical Simulations I Springer(2009).108 Pages.

Bosch; Technical Description for the Battery State Detection Software; issue v04; 19 pages.

Gregory L. Plett; Battery management system algorithms for HEV battery state-of-charge and state-of health estimation;Advanced Materials and Methods for Lithium-Ion Batteries, 2007: ISBN: 978-817895-279-6, Editor: Sheng Shui Zhang. 25 pages.

Hindawi Publishing Corporation; ISRN Applied Mathematics, vol. 2013, Article ID 953792, 7 pages , http://dx.doi.org/10.1155/2013/953792; The State of Charge Estimating Methods for Battery:A Review. Wen-Yeau Chang.

Chinese Office Action dated May 16, 2017 ; Application No. 201510190300.5; Applicant: GM Global Technology Operations LLC.; 4 pages.

Chinese Office Action dated Feb. 5, 2018 ; Application No. 201510190300.5; Applicant: GM Global Technology Operations LLC.; 7 pages.

* cited by examiner

40°C
SMALL SYMBOLS: DATA
LARGE SYMBOLS: FIT
(0.005 TO 8.43 Hz)
LEFT TO RIGHT: 80, 50, 20% SOC

STATE OF CHARGE ESTIMATOR AND METHODS OF MAKING AND USING THE SAME

TECHNICAL FIELD

The field to which the disclosure generally relates to includes battery estimators and methods of making and using the same.

BACKGROUND

Vehicles having a battery may use a battery state estimator.

SUMMARY OF SELECT ILLUSTRATIVE VARIATIONS

A number of variations include a method, which may include using at least a segment of voltage-based Battery State Estimation data, and using real-time linear regression, which may be a method of estimating future behavior of a system based on current and previous data points, to provide a robust and fast-adapting impedance response approximator. Linear regression may be performed by forming an RC circuit which is "equivalent" to electrochemical impedance spectroscopy data and processing the runtime values of that RC circuit using any number of known real-time linear regression algorithms including, but not limited, to a weighted recursive least squares (WRLS), Kalman filter or other means.

A number of variations may include a method including using a state of charge estimator including a RC circuit which is modeled based on electrochemical impedance spectroscopy data from an energy storage device such as a batter, supercapacitor or other electrochemical device and processing the runtime values of that RC circuit using any number of known real-time linear regression algorithms including, but not limited, to a weighted recursive least squares (WRLS), Kalman filter or other means. The method may also include a controller constructed and arranged to receive input from the state of charge estimator, compare the input from the estimator with predetermined values and take action such as send a signal representative of the state of charge or take other action when the input from the estimator is within a predetermined range of the predetermined values. In a number of variations the controller may be constructed and arranged to prevent a fuel burning engine of a vehicle including the energy storage device from turning off if the input from the estimate is within a predetermined values.

Other illustrative variations within the scope of the invention will become apparent from the detailed description provided hereinafter. It should be understood that the detailed description and specific examples, while disclosing variations within the scope of the invention, are intended for purposes of illustration only and are not intended to limit the scope of the invention.

BRIEF DESCRIPTION OF THE DRAWINGS

Select examples of variations within the scope of the invention will become more fully understood from the detailed description and the accompanying drawings, wherein.

DETAILED DESCRIPTION OF ILLUSTRATIVE VARIATIONS

The following description of the variations is merely illustrative in nature and is in no way intended to limit the scope of the invention, its application, or uses.

A number of variations may include a method including taking electrochemical impedance spectroscopy data for cells to be employed over SOC (state of charge) and temperature range of interest, fitting the electrochemical impedance spectroscopy data with an equivalent circuit over the temperature and SOC range. In a number of variations the equivalent circuit may have the fewest number of resistors, capacitors and inductors. In a number of variations the method may include using real-time linear regression, which may be a method of estimating future behavior of a system based on current and previous data points, to provide a robust and fast-adapting impedance response approximator/estimator. Linear regression may be performed by forming an RC circuit which is "equivalent" to electrochemical impedance spectroscopy data and processing the runtime values of that RC circuit using any number of known real-time linear regression algorithms including, but not limited, to a weighted recursive least squares (WRLS), Kalman filter or other means.

Figure 1A:
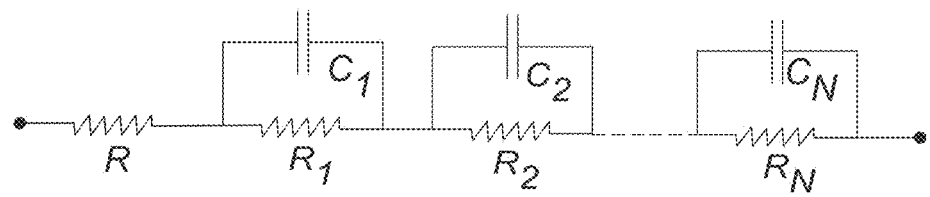
FIG. 1A illustrates a circuit including a resistor in series with N R∥C pairs according to a number of variations.
Figure 1B:
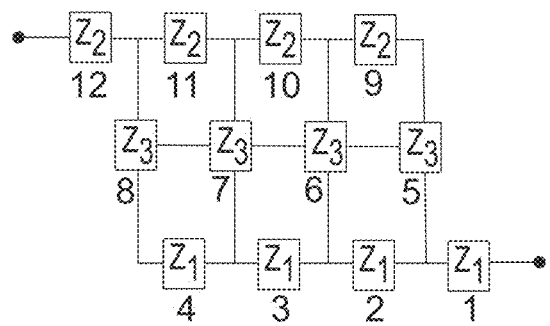
FIG. 1B shows a schematic diagram of a circuit that can be used to approximate a transmission line.
Figure 1C:
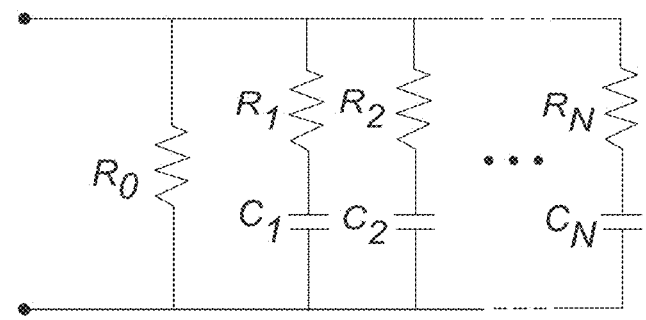
FIG. 1C illustrates a R∥N(R+C) circuit according to a number of variations.

As an example application, we use experimental impedance data on a traction-battery cell over a broad range of temperatures, SOCs, and frequencies to determine what type of equivalent circuit works well to represent the battery impedance. We find that the circuit shown in FIG. 1A works well for present-day lithium ion batteries. The general form of the equivalent circuit is a resistor in series with parallel resistor-capacitor combinations. A general formula for the impedance of an equivalent circuit for an arbitrary number of parallel resistor-capacitor combinations is given. We refer to such circuits as R+N(R∥C) circuits, where N is the number of the parallel resistor-capacitor combinations. This class of circuits provides an easy starting point for accurate simulations of small amplitude transients in lithium ion batteries. Furthermore, any circuit consisting of resistors and capacitors connected in an arbitrary fashion has the same impedance as an appropriately chosen R+N(R∥C) circuit. This means that, excluding the possibility of inductive effects, it suffices to restrict our attention to circuits of this type in order to match linear circuit elements to battery data. The R+N(R∥C) circuit has an analogue, the R∥N(R+C) circuit (shown in FIG. 1c), in which all series and parallel connections are interchanged. The admittance of the circuit 1a has a form similar to the impedance of circuit 1c, and vice versa.

Last, we derive analytic power expressions for R+N(R∥C) circuits. Here again, the method described applies to more general circuits containing arbitrary numbers of resistors, capacitors, and inductors. The impedance of such circuits can always be expressed as a quotient of two polynomials in frequency, and the roots of these polynomials are used to derive the analytic power expressions.

Even if R+N(R∥C) circuits are sufficient for matching models to data, it is sometimes desirable to consider other classes of circuits because they provide a convenient physical interpretation for known battery effects. A method based on Kirchhoff's Laws to express analytically the impedance for any such equivalent circuit comprised of linear circuit elements (e.g., an arbitrary number and configuration of resistors, capacitors, and inductors) will be described.

EXPERIMENTAL

Figure 2:
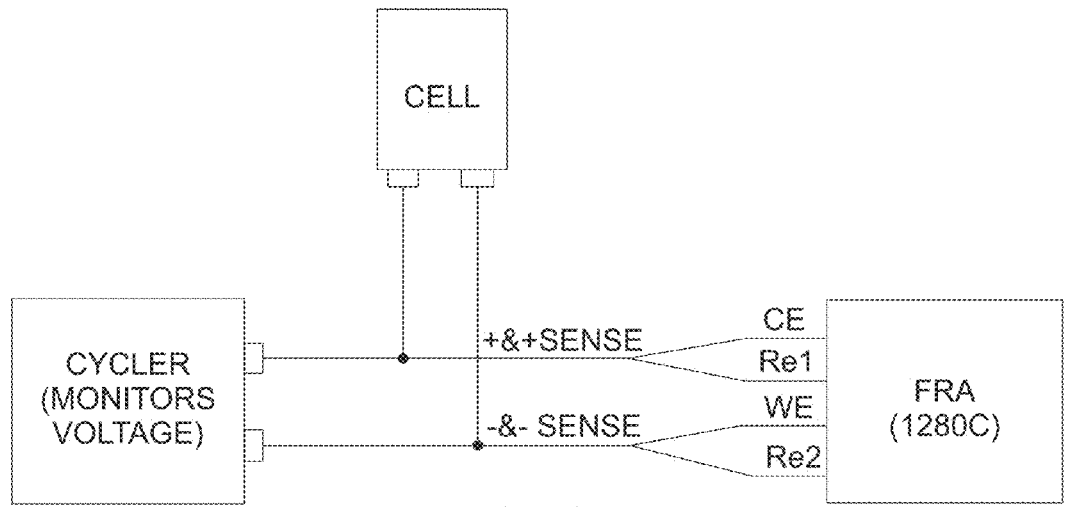
FIG. 2 is a schematic illustration of the electrical connections between the frequency response analyzer (FRA), cycler, and the electrochemical cell used to obtain data according to a number of variations.
Figure 3:
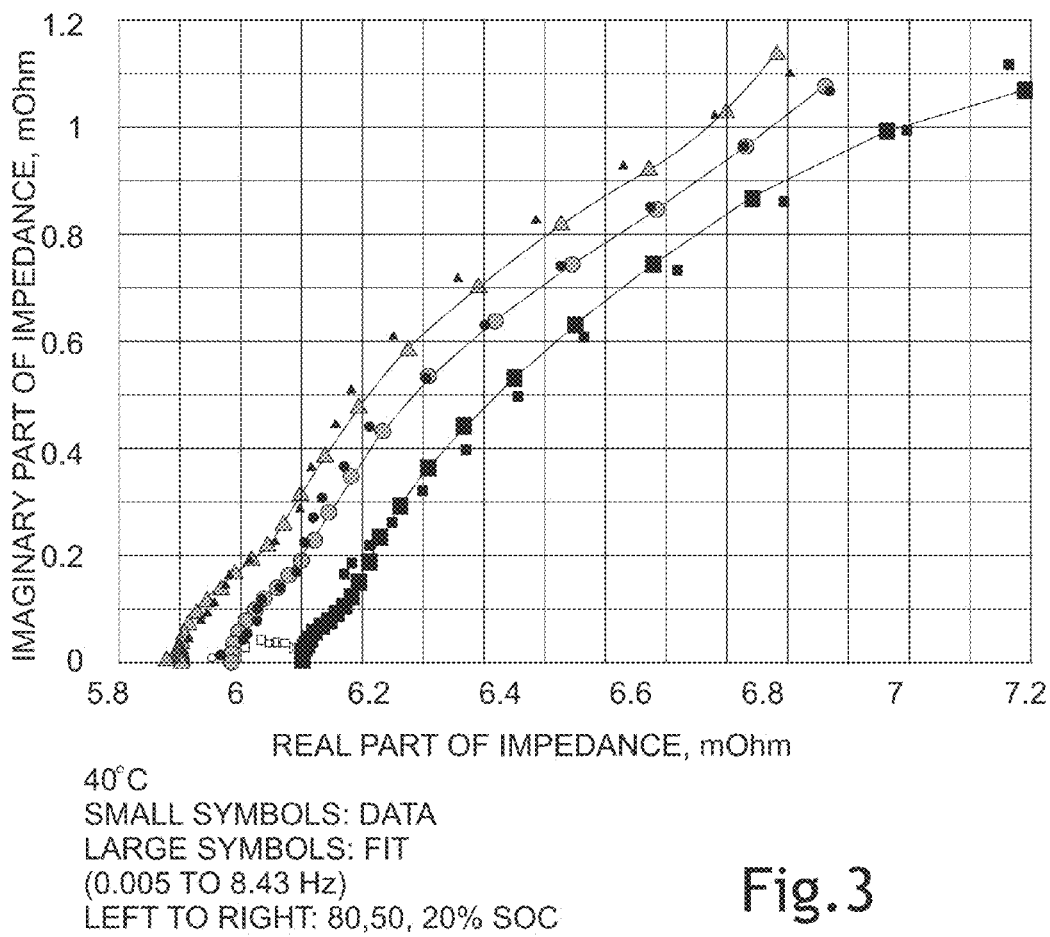
FIG. 3 is a Nyquist plot (40 degree C.) with the circuit of FIG. 1A with N=3.
Figure 4:
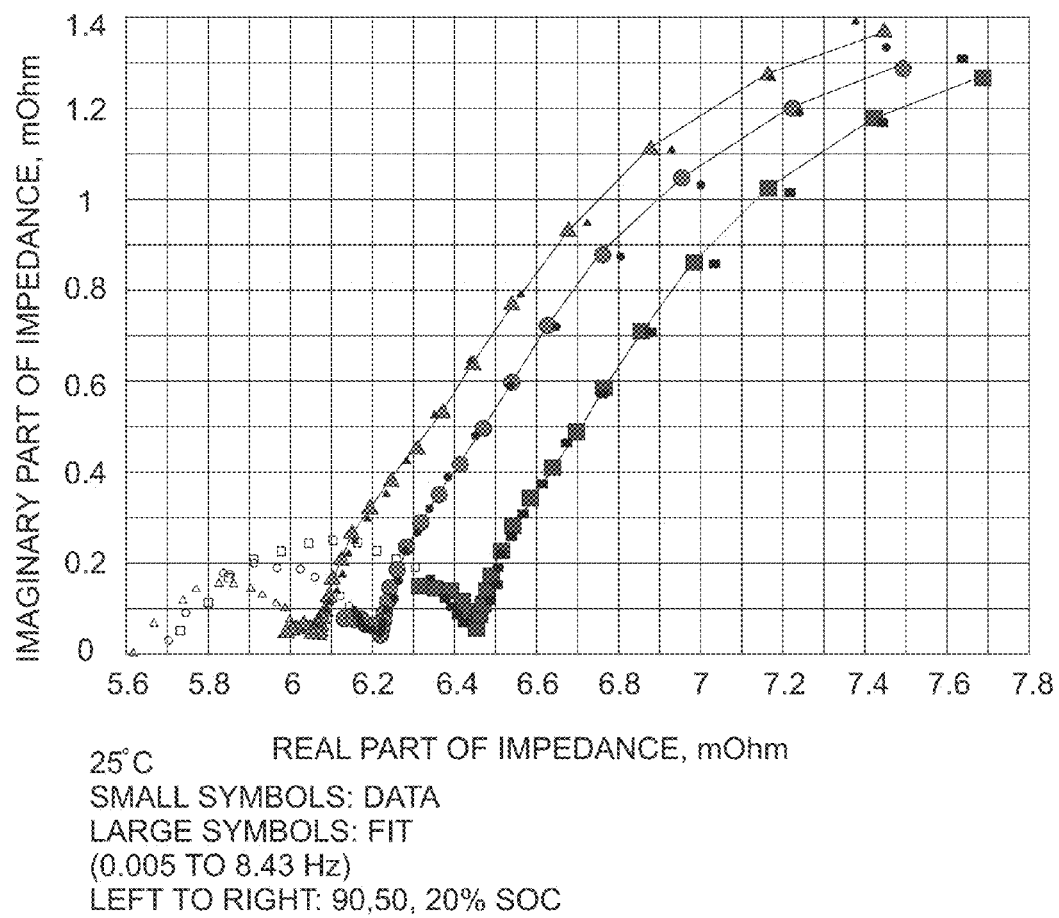
FIG. 4 is a Nyquist plot (25 degree C. with the circuit of FIG. 1A with N=3.
Figure 5:
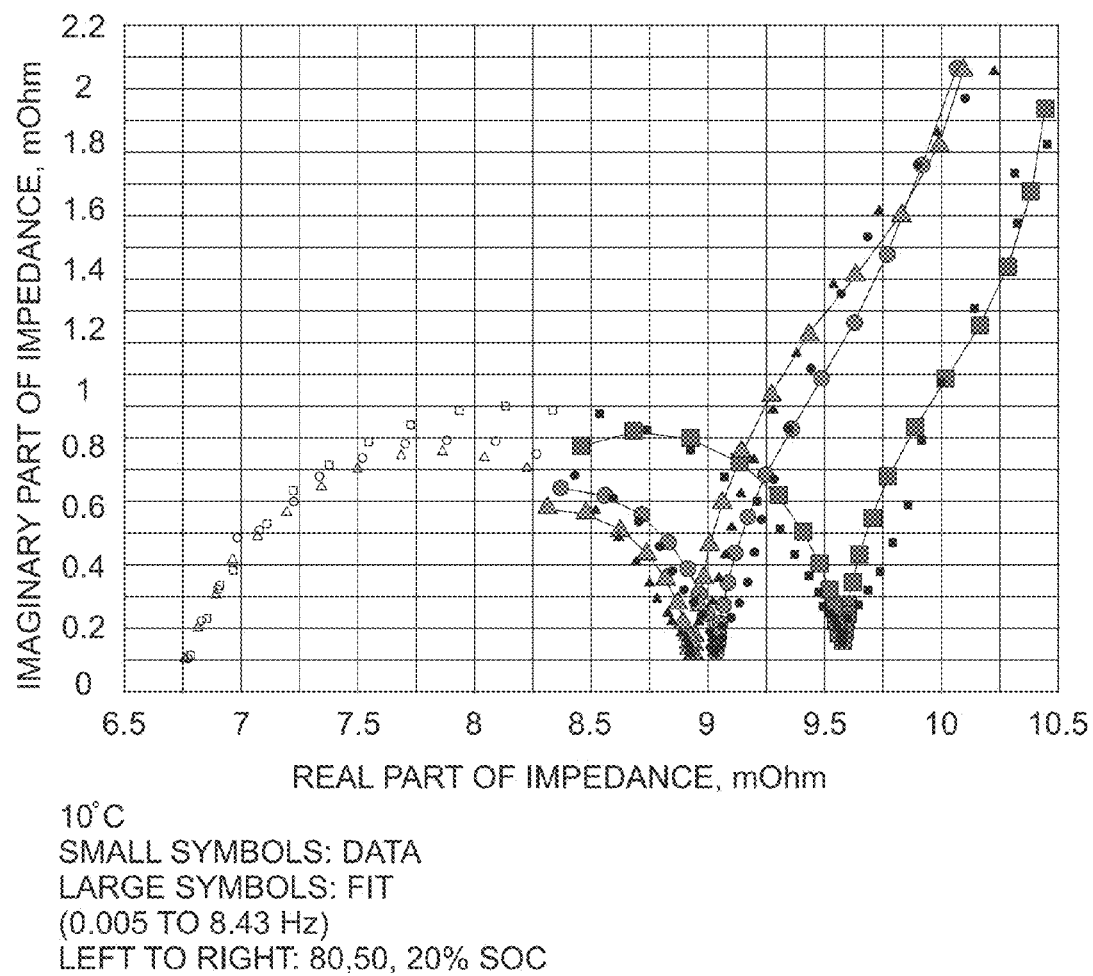
FIG. 5 is a Nyquist plot (10 degree C.) with the circuit of FIG. 1A with N=3.
Figure 6A:
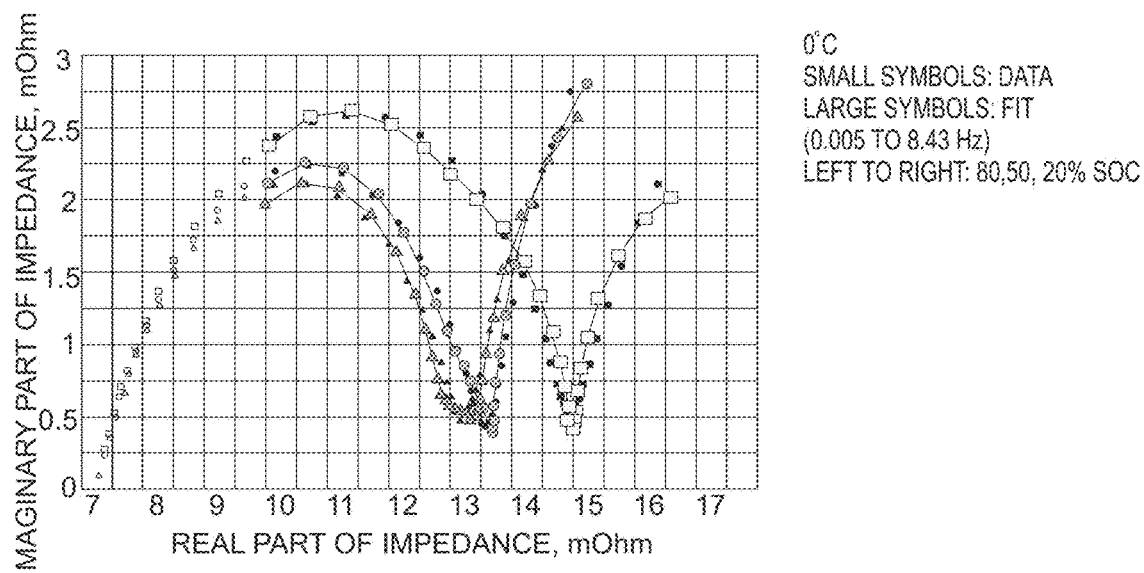
FIG. 6A is a Nyquist plot (0 degree C.) with the circuit of FIG. 1A with N=3.
Figure 6B:
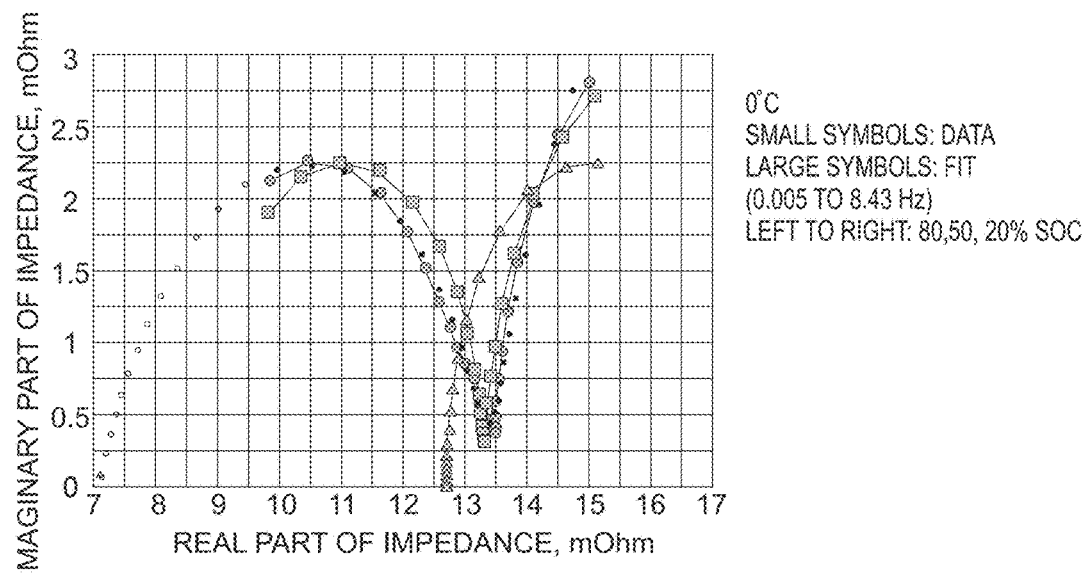
FIG. 6B is a Nyquist plot (0 degree C.) with the circuit of FIG. 1A with N=3, 2 and 1.
Figure 7:
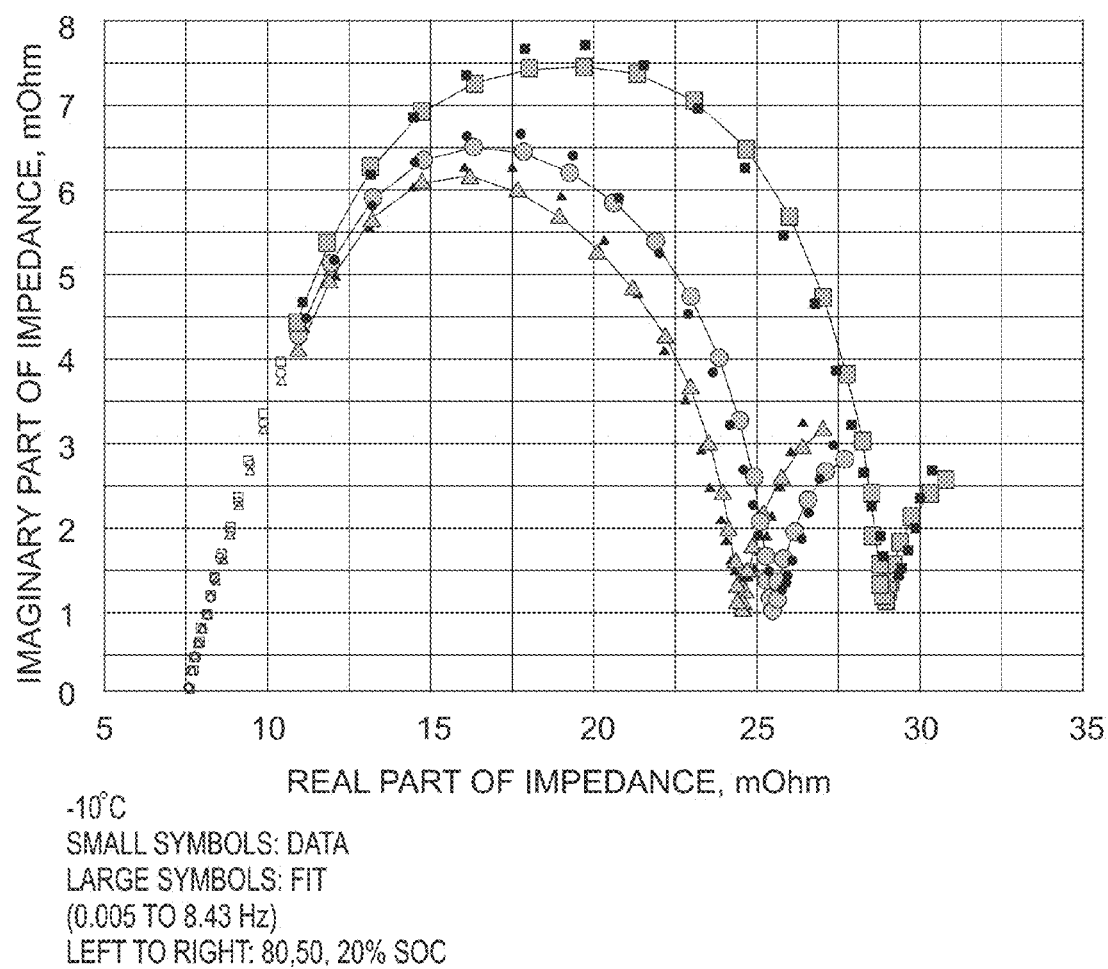
FIG. 7 is a Nyquist plot (−10 degree C.) with the circuit of FIG. 1A with N=3.

Instrumentation and cell. The experimental impedance data used in the example application is generated using an LG P1.5A (Chevrolet Volt, GM Part Number 22836139) lithium-ion traction-battery cell with a nominal voltage of 3.6V and nominal capacity of 20 Ah. The positive electrode consists of $Ni_xMn_yCo_zO_2$ (70 wt. %, x+y+z=1) and $LiMn_2O_4$ (30 wt. %); the negative electrode consists of surface-modified graphite and soft carbon. The primary equipment used to perform the measurements is the Solartron 1280C frequency response analyzer (FRA), which has a built in potentiostat for controlling current and voltage. This equipment is capable of measuring voltage between −14.5 and 14.5 volts, supplying current of between −2 and 2 A, and generating sinusoidal waveforms to perform single frequency impedance sweeps from 1 mHz to 20 kHz. The connection between the FRA and the measured cell is a standard 4 terminal connection: two of the terminals are used as the positive and negative supply while the other two are used for sensing. By placing the high impedance sensing leads directly on the terminals of the device being measured, we insure that there is no significant voltage change due to sensing cable impedance. In addition to the FRA, an environmental chamber is used to manually set the battery temperature to the desired value. An Arbin battery cycler, which can be programmed to provide controlled current or potential or waveforms, is used to set the SOC of the battery to desired values. A schematic of the setup is shown in FIG. 2.

We obtained the impedance of the cell at various SOCs and temperatures. The SOC range is selected to be 10% to 90% while the temperature range is selected to be from −10 to 45° C.; both ranges are of interest for automotive applications. For each test, we use the environmental chamber and the battery cycler to set the cell to the desired SOC and temperature combination. The battery is then left to equilibrate (typically 3 hours). Then the FRA is used to collect the impedance data from 20 kHz down to 2 mHz.

Data and impedance analysis Plots of the impedance measurements are given in FIG. 3 through FIG. 7. For FIGS. 3-7, the symbols are experimental data and the solid lines come from fitting the R+N(R∥C) circuit parameters to the data with N=3. Shown in each figure are the relevant experimental conditions (including SOC and temperature). For traction applications, we are most interested in frequencies ranging from about 5 mHz to 10 Hz. Frequencies higher than 10 Hz drive unnecessary cost into data collection and execution times for battery state estimation; vehicles today commonly provide synchronous current-voltage data every 0.1 seconds, implying that constructing an equivalent circuit with the intent of capturing electrochemical phenomena associated with frequencies higher than 1/(0.1 s)=10 Hz is of limited utility. Frequencies below 5 mHz would be reflective of electrochemical phenomena associated with durations longer than 1/(0.005 Hz)=200 s; many changes occur over such long durations that we do not attempt to reproduce with a BSE, including temperature changes. Thus for FIG. 3 through FIG. 7, we employ the circuit depicted in FIG. 1a, with N=3, and we fit parameters of the circuit over the frequency range of 5 mHz to 8.43 Hz. Higher frequency data are shown in the plots as well, but they are not used in our analysis. We find that the circuit depicted in FIG. 1a, with N=3, can reproduce all of the measured impedance spectra to sufficient accuracy for battery state estimation purposes. In principle, one could continue to add more RC pairs to obtain progressively higher accuracy in terms of fitting the data, and the mathematical methods derived below can be used to address any number of RC pairs.

We will refer to a resistor and capacitor in parallel as an RC-pair. The impedance of an RC-pair is given as $$Z(\omega) = \frac{R}{1 + j\omega RC} \quad (1)$$

We are interested in a circuit consisting of a single resistor and two RC-pairs, all in series. The corresponding impedance becomes $$Z(\omega) = \frac{R_1}{1 + jR_1C_1\omega} + \frac{R_2}{1 + jR_2C_2\omega} + R = \frac{\tilde{V}}{\tilde{I}} \quad (2)$$

$$= \frac{R + R_1 + R_2 + j\omega(R[R_1C_1 + R_2C_2] + R_1R_2[C_1 + C_2]) + (j\omega)^2 RR_1R_2C_1C_2}{1 + j\omega(R_1C_1 + R_2C_2) + (j\omega)^2 R_1R_2C_1C_2}$$

$$= \frac{A_1 + j\omega A_2 + (j\omega)^2 A_3}{1 + j\omega A_4 + (j\omega)^2 A_5}$$

In the above, $\tilde{V}$ is the Fourier transform of the voltage V(t), $\tilde{I}$ is the Fourier transform of the current I(t), and the five coefficients $A_i$ are given as $A_1 = R + R_1 + R_2$ $A_2 = R[R_1C_1 + R_2C_2] + R_1R_2[C_1 + C_2]$ $A_3 = RR_1R_2C_1C_2$ $A_4 = R_1C_1 + R_2C_2$ $A_5 = R_1R_2C_1C_2 \quad (3)$ We can rewrite this as $$\tilde{V}(1+j\omega A_4+(j\omega)^2 A_5)=\tilde{I}(A_1+j\omega A_2+(j\omega)^2 A_3) \quad (4)$$

Note that $(j\omega)^n\tilde{V}$ is the Fourier transform of $d^nV/dt^n$, with a similar statement holding for current. Thus, we can invert Fourier transform equation (4) to $$V_1 + A_4\frac{dV_1}{dt} + A_5\frac{d^2V_1}{dt^2} = A_1 I + A_2\frac{dI}{dt} + A_3\frac{d^2I}{dt^2} \quad (5)$$

In the above equation, we have assumed that $V_1=V-V_0$, where $V_0$ is the OCV. Equation 5 can be reformulated as $$V - V_0 + A_4\frac{dV}{dt} + A_5\frac{d^2V}{dt^2} = A_1 I + A_2\frac{dI}{dt} + A_3\frac{d^2I}{dt^2} \quad (6)$$

where we are now assuming that all time derivatives of $V_0$ vanish. We assume in addition that at time zero the current is zero (although the voltage need not be), whereas the derivatives of both current and voltage all vanish at time zero. We now want to integrate equation 6 two times to eliminate all derivatives, and we must pay careful attention to all of the initial conditions, especially for the voltage. The first integral becomes $$\int_0^t V(s_1)ds_1 - V_0 t + A_4(V(t)-V(0)) + A_5\frac{dV}{dt}(t) = \quad (7)$$

$$A_1\int_0^t I(s_1)ds_1 + A_2 I(t) + A_3\frac{dI}{dt}(t)$$

Note that we distinguish between $V_0$, which is the OCV, and $V(0)$, which is the voltage at time zero. The second integral becomes $$\int_0^t\int_0^{s_2} V(s_1)ds_1 ds_2 - V_0\frac{t^2}{2} + A_4\int_0^t (V(s_1)-V(0))ds_1 + \quad (8)$$

$$A_5(V(t)-V(0)) = A_1\int_0^t\int_0^{s_2} I(s_1)ds_1 ds_2 + A_2\int_0^t I(s_1)ds_1 + A_3 I(t)$$

This is the relationship between voltage and current that we want to optimize. Before doing this we must first discretize and then show how to evaluate this equation recursively. For any function $f(t)$ define $$S(f)(t) = \int_0^t f(s_1)ds_1, \quad (9)$$

$$S^2(f)(t) = \int_0^t\int_0^{s_2} f(s_1)ds_1 ds_2$$

To discretize, choose a time spacing $\Delta t$ and evaluate the integrals using the trapezoidal rule, which can be done recursively as follows $$S(f)(n\Delta t) = S(f)([n-1]\Delta t) + \frac{\Delta t}{2}(f(n\Delta t)+f([n-1]\Delta t)) \quad (10)$$

$$S^2(f)(n\Delta t) = S^2(f)([n-1]\Delta t) + \frac{\Delta t}{2}(S(f)(n\Delta t)+S(f)([n-1]\Delta t))$$

Then the discretized formulation of equation (6) becomes $$S^2(V)(n\Delta t) - V_0 S^2(1)(n\Delta t)A_4 S(V-V(0))(n\Delta t) + A_5(V-V(0))(n\Delta t) = \quad (11)$$

$$A_1 S^2(I)(n\Delta t) + A_2 S(I)(n\Delta t) + A_3 I(n\Delta t)$$

which can be evaluated recursively using equations (8). The optimization takes place using the measured values of both voltage and current. If desired, a "forgetting factor" $\lambda$ can also be used. Then we would like to choose the coefficients $A_1, \ldots, A_5$ so as to minimize the error $$e(n\Delta t) = \quad (12)$$

$$\sum_{i=0}^n \lambda^{n-i} \left( \begin{array}{c} S^2(V^{meas})(i\Delta t) - V_0 S^2(1) + \\ A_4 S(V^{meas} - V^{meas}(0))(i\Delta t) + \\ A_5[V^{meas}(i\Delta t) - V^{meas}(0)] - \\ A_1 S^2(I^{meas})(i\Delta t) - A_2 S(I^{meas})(i\Delta t) - A_3 I^{meas}(i\Delta t) \end{array} \right)^2$$

This problem is linear in the unknowns $A_i$ and $V_0$ and the standard least squares methods can be used to solve it recursively. Once $A_1, \ldots, A_5$ have been determined, they can be used to solve for $R$, $R_1$, $C_1$, $R_2$, $C_2$.

Generalization to N RC-Pairs

For N RC-pairs, we have $$Z(\omega) = R + \sum_{i=1}^N \frac{R_i}{1+j\omega R_i C_i} = \frac{A_1 + j\omega A_2 + \ldots + (j\omega)^N A_{N+1}}{1+j\omega A_{N+2} + \ldots + (j\omega)^N A_{2N+1}} \quad (13)$$

The first step is to optimize the values $A_1, \ldots, A_{2N+1}$ by matching to current-voltage data. It is assumed that all of the derivatives of voltage and current at times less than zero are vanishing (initial conditions for the fitting). The procedure is analogous to what was done above, and the analogue to equation 8 is $$\int_0^t\int_0^{s_N}\ldots\int_0^{s_2} V(s_1)ds_1 ds_2 \ldots ds_N - V_0\frac{t^N}{N!} + \quad (14)$$

$$A_{N+2}\int_0^t\int_0^{s_{N-1}}\ldots\int_0^{s_2}(V(s_1)-V(0))ds_1 ds_2 \ldots ds_{N-1} +$$

$$A_{2N+1}(V(t)-V(0)) =$$

$$A_1\int_0^t\int_0^{s_N}\ldots\int_0^{s_2} I(s_1)ds_1 ds_2 \ldots ds_N + A_N\int_0^t I(s_1)ds_1 + A_{N+1} I(t)$$

Equation 9 becomes $$S(f)(t) = \int_0^t f(s_1)ds_1, \quad (15)$$

$$S^2(f)(t) = \int_0^t \int_0^{s_2} f(s_1)ds_1 ds_2, \ldots ,$$

$$S^N(f)(t) = \int_0^t \int_0^{s_N} \ldots \int_0^{s_2} f(s_1)ds_1 ds_2 \ldots ds_N$$

and equation 10 becomes $$S(f)(n\Delta t) = S(f)([n-1]\Delta t) + \frac{\Delta t}{2}(f(n\Delta t) + f([n-1]\Delta t)) \quad (16)$$

$$S^2(f)(n\Delta t) = S^2(f)([n-1]\Delta t) + \frac{\Delta t}{2}(S(f)(n\Delta t) + S(f)([n-1]\Delta t))$$

$$\vdots$$

$$S^N(f)(n\Delta t) = S^N(f)([n-1]\Delta t) +$$

$$\frac{\Delta t}{2}(S^{N-1}(f)(n\Delta t) + S^{N-1}(f)([n-1]\Delta t))$$

Equation 11 now becomes $$S^N(V)(n\Delta t) - V_0 S^N(1) + A_{N+2} S^{N-1}(V-V(0))(n\Delta t) + \ldots + A_{2N} S(V-V(0))(n\Delta t) + A_{2N+1}(V-V(0))(n\Delta t) = A_1 S^N(I)(n\Delta t) + \ldots + A_N S(I)(n\Delta t) + A_{N+1} I(n\Delta t) \quad (17)$$

The analogue to equation 12 is $$e(n\Delta t) = \sum_{i=0}^n \lambda^{n-i} \begin{pmatrix} S^N(V^{meas})(i\Delta t) - V_0 S^N(1) + \ldots + \\ A_{2N} S(V^{meas} - V^{meas}(0))(i\Delta t) + \\ A_{2N+1}(V^{meas}(i\Delta t) - V^{meas}(0)) - \\ A_1 S^N(I^{meas})(i\Delta t) - \ldots - \\ A_N S(I^{meas})(i\Delta t) - A_{N+1} I^{meas}(i\Delta t) \end{pmatrix}^2 \quad (18)$$

In general, once the coefficients $A_i$ have been optimized, the values for R, $R_i$ and $C_i$ may be desired. To find them, note that the denominator of the impedance expression in equation 11 is $$1 + j\omega A_{N+2} + \ldots + (j\omega)^{2N} A_{2N+1} = \prod_{i=1}^N (1 + j\omega R_i C_i) \quad (17)$$

Thus the roots of this polynomial $$Q(s) = 1 + \sum_{i=N+2}^{2N+1} A_i s^{i-N-1} \quad (18)$$

will be the values $-1/R_i C_i$. It will thus be necessary to find the N roots to equation 18. Once these roots have been found, it is possible to expand $z(\omega)$ in partial fractions, as shown in equation 11 above, and this will determine the individual values for $R_i$ and $C_i$ and R.

It should be noted that there is a possibility that some of the roots to equation 18 for $R_i C_i$ will turn out to be either negative or complex. Negative values would indicate an unstable system and complex values would indicate an oscillatory system response. An interpretation of this would be that we are starting to try to fit circuit elements to noise in our system, and the solution to this is to try to reduce the number N of RC pairs until the optimized time constants are all positive.

A number of variations include a method, which may include using at least a segment of voltage-based Battery State Estimation data, and using real-time linear regression, which may be a method of estimating future behavior of a system based on current and previous data points, to provide a robust and fast-adapting impedance response approximator. Linear regression may be performed by forming an RC circuit which is "equivalent" to electrochemical impedance spectroscopy data and processing the runtime values of that RC circuit using any number of known real-time linear regression algorithms including, but not limited, to a weighted recursive least squares (WRLS), Kalman filter or other means.

A number of variations may include a method including using a state of charge estimator including a RC circuit which is modeled based on electrochemical impedance spectroscopy data from an energy storage device such as a battery, supercapacitor or other electrochemical device and processing the runtime values of that RC circuit using any number of known real-time linear regression algorithms including, but not limited, to a weighted recursive least squares (WRLS), Kalman filter or other means. The method may also include a controller constructed and arranged to receive input from the state of charge estimator, compare the input from the estimator with predetermined values and take action such as send a signal representative of the state of charge or take other action when the input from the estimator is within a predetermined range of the predetermined values. In a number of variations the controller may be constructed and arranged to prevent a fuel burning engine of a vehicle including the energy storage device from turning off if the input from the estimate is within a predetermined ranged values.

The above description of select variations within the scope of the invention is merely illustrative in nature and, thus, variations or variants thereof are not to be regarded as a departure from the spirit and scope of the invention.

What is claimed is:

1. A method comprising:
   determining electrochemical impedance spectroscopy data of a battery using an analyzer;
   providing a vehicle including a vehicle battery;
   providing a controller constructed and arranged to receive input from a battery state estimator having a linear RC circuit;
   estimating a state of charge of the vehicle battery using the battery state estimator, wherein the linear RC circuit includes a number of components and operates in a manner approximating the electrochemical impedance spectroscopy data of the battery from the analyzer, wherein a number of values for the number of components included in the linear RC circuit are derived from a fractional polynomial, in jω, representative of the electrochemical impedance spectroscopy data;
   processing the runtime values of that linear RC circuit using a real-time linear regression algorithm provided in the battery state estimator to produce an estimated future behavior of the vehicle battery; and, using the controller to send a signal to a vehicle component based upon the estimated future behavior of the vehicle battery.

2. A method as set forth in claim 1 wherein the linear circuit includes a resistor in series to N resistor-capacitor pairs.

3. A method as set forth in claim 2 wherein N is greater than 2.

4. A method as set forth in claim 1 wherein the algorithm uses a weighted recursive least squares (WRLS) filter.

5. A method as set forth in claim 1 wherein the algorithm uses a Kalman filter.

6. A method comprising:
estimating a state of charge of an energy storage device using a state of charge estimator including a linear RC circuit;
measuring electrochemical impedance spectroscopy data of the energy storage device using an analyzer;
determining a number of values for the number of components included in the linear RC circuit according to a derivation process wherein a fractional polynomial in $j\omega$, representative of the impedance spectroscopy data is determined, a time-domain expression that is linear with regard to the number of values for the number of circuit components is obtained by transforming the fractional polynomial, and the values for the number of circuit components are derived from the time-domain expression;
building the linear RC circuit based at least upon the derivation process;
processing the runtime values of the linear circuit using a real-time linear regression algorithm in the state of charge estimator to estimate future behavior of the energy storage device;
providing a controller constructed and arranged to receive input from the state of charge estimator;
comparing the input from the state of charge estimator with predetermined values; and,
using the controller to send a signal to a vehicle component when the input from the state of charge estimator is within a predetermined range of the predetermined values.

7. A method as set forth in claim 6 wherein the linear circuit includes a resistor in series to N resistor-capacitor pairs.

8. A method as set forth in claim 7 wherein N is greater than 2.

9. A method as set forth in claim 6 wherein the algorithm uses a weighted recursive least squares (WRLS) filter.

10. A method as set forth in claim 6 wherein the algorithm uses a Kalman filter.

11. A method as set forth in claim 6 wherein sending a signal to the vehicle component comprises sending a signal to a fuel burning engine of a vehicle including the energy storage device to prevent the engine from turning off.

12. A method as set forth in claim 6 wherein the sending a signal the vehicle component comprises sending a signal representative of the state of charge of the energy storage device to the vehicle component.

13. A method as set forth in claim 6 wherein the energy storage device is a battery.

14. A method as set forth in claim 6 wherein the energy storage device is a supercapacitor.

* * * * *